(12) United States Patent
Sakamoto et al.

(10) Patent No.: US 9,005,873 B2
(45) Date of Patent: Apr. 14, 2015

(54) COMPOSITION FOR FORMING RESIST UNDERLAYER FILM FOR EUV LITHOGRAPHY

(71) Applicant: Nissan Chemical Industries, Ltd., Tokyo (JP)

(72) Inventors: Rikimaru Sakamoto, Toyama (JP); Takafumi Endo, Toyama (JP); Bangching Ho, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 14/099,278

(22) Filed: Dec. 6, 2013

(65) Prior Publication Data

US 2014/0099791 A1    Apr. 10, 2014

Related U.S. Application Data

(62) Division of application No. 13/264,234, filed as application No. PCT/JP2010/056784 on Apr. 15, 2010, now abandoned.

(30) Foreign Application Priority Data

Apr. 21, 2009 (JP) ................................. 2009-102859

(51) Int. Cl.

| G03F 7/004 | (2006.01) |
|---|---|
| C08L 61/00 | (2006.01) |
| C08G 59/00 | (2006.01) |
| H01L 21/308 | (2006.01) |
| G03F 7/09 | (2006.01) |
| H01L 21/311 | (2006.01) |
| C08L 63/00 | (2006.01) |
| C08G 59/08 | (2006.01) |
| G03F 7/11 | (2006.01) |

(52) U.S. Cl.
CPC .......... *H01L 21/31116* (2013.01); *G03F 7/094* (2013.01); *C08L 63/00* (2013.01); *C08G 59/08* (2013.01); *G03F 7/091* (2013.01); *G03F 7/11* (2013.01); *H01L 21/3081* (2013.01); *Y10S 430/106* (2013.01)

(58) Field of Classification Search
CPC ........... G03F 7/004; G03F 7/091; G03F 7/11; G03F 7/236; G03F 7/094; H01L 21/3081; H01L 21/31116; C09D 161/06; C08L 63/00; C08G 59/00; C08G 59/08
USPC ........ 430/270.1, 271.1, 905; 524/541; 528/98
See application file for complete search history.

(56) References Cited

U.S. PATENT DOCUMENTS

| 5,693,691 A | 12/1997 | Flaim et al. |
|---|---|---|
| 5,919,599 A | 7/1999 | Meador et al. |
| 2005/0118749 A1 | 6/2005 | Sakamoto et al. |
| 2006/0134558 A1 | 6/2006 | Kim et al. |
| 2007/0190459 A1 | 8/2007 | Hashimoto et al. |

FOREIGN PATENT DOCUMENTS

| EP | 1 484645 A1 | 12/2004 |
|---|---|---|
| JP | A-2006-188681 | 7/2006 |
| JP | A-2007-241259 | 9/2007 |
| WO | WO 03/071357 A1 | 8/2003 |
| WO | WO 2008/105266 A1 | 9/2008 |

OTHER PUBLICATIONS

Lynch et al., "Properties and Performance of Near UV Reflectivity Control Layers," *Proc. SPIE*, vol. 2195, pp. 225-229, 1994.
Taylor et al., "Methacrylate Resists and Antireflective Coatings for 193 nm Lithography," *Proc. SPIE*, vol. 3678, pp. 174-185, Mar. 1999.
Meador et al., "Recent Progress in 193 nm Antireflective Coatings," *Proc. SPIE*, vol. 3678, pp. 800-809, Mar. 1999.
Written Opinion of the International Searching Authority issued in Application No. PCT/JP2010/056784; Dated May 25, 2010.
International Search Report issued in Application No. PCT/JP2010/056784; Dated May 25, 2010 (With Translation).

*Primary Examiner* — Amanda C Walke
(74) *Attorney, Agent, or Firm* — Oliff PLC

(57) ABSTRACT

A method for producing a semiconductor device includes the steps of: applying a composition for forming a resist underlayer film for EUV lithography including a novolac resin containing a halogen atom onto a substrate having a film to be fabricated for forming a transferring pattern and baking the composition so as to form a resist underlayer film for EUV lithography; and applying a resist for EUV lithography onto the resist underlayer film for EUV lithography, irradiating, with EUV through a mask, the resist underlayer film for EUV lithography and a film of the resist for EUV lithography on the resist underlayer film, developing the film of the resist for EUV lithography, and transferring an image formed in the mask onto the substrate by dry etching so as to form an integrated circuit device.

8 Claims, No Drawings

COMPOSITION FOR FORMING RESIST UNDERLAYER FILM FOR EUV LITHOGRAPHY

This application is a divisional of U.S. patent application Ser. No. 13/264,234 filed Oct. 13, 2011, which is the U.S. national phase of International Application No. PCT/JP2010/056784, filed Apr. 15, 2010. The entire disclosures of the parent applications are incorporated herein by reference.

TECHNICAL FIELD

The present invention relates to a compositions of resist underlayer films for EUV lithography that is used in a production process of devices employing EUV lithography, that reduces adverse effects caused by EUV, and that has a beneficial effect on the formation of a favorable resist pattern, and relates to a method for forming resist patterns using the composition of resist underlayer films for EUV lithography.

BACKGROUND ART

Conventionally, microfabrication has been carried out using photolithography techniques in the production of semiconductor devices. The microfabrication is a fabrication process in which a thin film of a photoresist composition is formed on a substrate to be fabricated such as a silicon wafer, active rays such as ultraviolet rays are applied onto the film through a mask pattern with a pattern of a semiconductor device followed by development, and the substrate to be fabricated such as a silicon wafer is etched using the obtained photoresist pattern as a protective film. In recent years, semiconductor devices have been further integrated, and the active rays to be used have had a shorter wavelength from a KrF excimer laser (248 nm) to an ArF excimer laser (193 nm). Such a change raises serious problems due to the effects of irregular reflections of active rays from a substrate and standing waves. Thus, a method of providing a bottom anti-reflective coating (BARC) between the photoresist and the substrate as a resist underlayer film that suppresses the reflections has been widely employed.

Inorganic bottom anti-reflective coatings made of titanium, titanium dioxide, titanium nitride, chromium oxide, carbon, α-silicon, or other substances and organic bottom anti-reflective coatings composed of a light-absorbing substance and a polymer compound are known as the bottom anti-reflective coatings. The former needs equipment such as a vacuum deposition system, a CVD system, and a sputtering system for the coating formation, but the latter has advantages because special equipment is not required, and there have been many studies on the latter.

Examples of the organic bottom anti-reflective coatings include an acrylic resin bottom anti-reflective coating that includes a hydroxy group as a cross-linkable group and a light-absorbing group in a single molecule (see Patent Document 1) and a novolac resin bottom anti-reflective coating that includes a hydroxy group as a cross-linkable group and a light-absorbing group in a single molecule (see Patent Document 2).

It is described that physical properties required for the organic bottom anti-reflective coating material are, for example, large absorption of light and radiation rays, no intermixing with a photoresist layer (being insoluble in a resist solvent), no diffusion of a low molecular weight compound from a bottom anti-reflective coating material into a resist applied on the bottom anti-reflective coating during application or drying by heat, and a dry etching rate larger than that of a photoresist (see Non-patent Document 1).

In recent years, as a next-generation photolithography technique subsequent to the photolithography technique using the ArF excimer laser (193 nm), an ArF immersion lithography technique by exposure through water has been actively studied. However, the photolithography technique using light has been reaching its limit. Hence, an EUV lithography technique using EUV (a wavelength of 13.5 nm) has been drawing attention as a new lithography technique subsequent to the ArF immersion lithography technique.

In the production process of devices employing EUV lithography, adverse effects caused by an underlying substrate or EUV raise problems that, for example, a resist pattern for the EUV lithography is made into a skirt shape or an undercut shape, thus a favorable straight resist pattern cannot be formed, and a sensitivity to EUV is too low to achieve sufficient throughput. Thus, the EUV lithography process does not require the resist underlayer film (bottom anti-reflective coating) having the anti-reflection properties, but requires a resist underlayer film for EUV lithography so as to reduce these adverse effects, to form a favorable straight resist pattern, and to improve the resist sensitivity.

On the resist underlayer film for EUV lithography, a resist is applied after the film formation. Thus, as with the bottom anti-reflective coating, the resist underlayer film for EUV lithography requires the characteristics of no intermixing with the resist layer (being insoluble in a resist solvent) and no diffusion of a low molecular weight compound from a bottom anti-reflective coating material into a resist applied on the bottom anti-reflective coating during application or drying by heat.

In the generation using the EUV lithography, the resist pattern has an extremely small width, and hence the resist for EUV lithography is required to be a thinner film. To address this, the time for a removal process of an organic bottom anti-reflective coating by etching is required to be significantly reduced, and this requires a resist underlayer film for EUV lithography that can be used as a thin film or a resist underlayer film for EUV lithography that provides a large selection ratio of the etching rate with respect to that of a resist for EUV lithography.

RELATED ART DOCUMENTS

Patent Documents

Patent Document 1: U.S. Pat. No. 5,919,599 specification
Patent Document 2: U.S. Pat. No. 5,693,691 specification Non-Patent Documents Non-patent Document 1: Proc. SPIE, Vol. 3678, 174-185 (1999)
Non-patent Document 2: Proc. SPIE, Vol. 3678, 800-809 (1999)
Non-patent Document 3: Proc. SPIE, Vol. 2195, 225-229 (1994)

DISCLOSURE OF THE INVENTION

Problem to be Solved by the Invention

The present invention provides a composition for forming a resist underlayer film for EUV lithography that is used in an EUV lithography process in the production of semiconductor devices. The present invention also provides a resist underlayer film for EUV lithography that reduces adverse effects caused by an underlying substrate or EUV to form a favorable straight resist pattern, that can improve the resist sensitivity, that does not cause intermixing with a resist layer, and that has a dry etching rate larger than that of a resist. The present invention further provides a method for forming a resist pattern for EUV lithography that uses the composition for forming a resist underlayer film for EUV lithography.

Means for Solving the Problem

The present invention provides, as a first aspect, a composition for forming a resist underlayer film for an EUV lithography process used in production of a semiconductor device including a novolac resin containing a halogen atom;

as a second aspect, the composition for forming a resist underlayer film according to the first aspect, in which the novolac resin containing a halogen atom includes a cross-linkable group composed of an epoxy group, a hydroxy group, or a combination of an epoxy group and a hydroxy group;

as a third aspect, the composition for forming a resist underlayer film according to the first aspect or the second aspect, in which the halogen atom is a bromine atom or an iodine atom;

as a fourth aspect, the composition for forming a resist underlayer film according to any one of the first aspect to the third aspect, in which the novolac resin containing a halogen atom is a reaction product of a novolac resin or an epoxidized novolac resin and a halogenated benzoic acid;

as a fifth aspect, the composition for forming a resist underlayer film according to any one of the first aspect to the third aspect, in which the novolac resin containing a halogen atom is a reaction product of a glycidyloxy novolac resin and diiodosalicylic acid;

as a sixth aspect, the composition for forming a resist underlayer film according to any one of the first aspect to the fifth aspect, in which the composition includes the novolac resin containing a halogen atom, a cross-linking agent, a cross-linking catalyst, and a solvent;

as a seventh aspect, the composition for forming a resist underlayer film according to any one of the first aspect to the sixth aspect further including an acid generator;

as an eighth aspect, the composition for foaming a resist underlayer film according to any one of the first aspect to the seventh aspect, in which the novolac resin containing a halogen atom is a novolac resin having a weight average molecular weight of 1,000 to 100,000;

as a ninth aspect, a resist underlayer film for an EUV lithography process used in production of a semiconductor device, obtained by applying the composition for forming a resist underlayer film as described in any one of the first aspect to the eighth aspect onto a substrate and baking the composition; and as a tenth aspect, a method for producing a semiconductor device including the steps of: applying the composition for forming a resist underlayer film for EUV lithography as described in any one of the first aspect to the eighth aspect onto a substrate having a film to be fabricated for forming a transferring pattern and baking the composition so as to form a resist underlayer film for EUV lithography; and applying a resist for EUV lithography onto the resist underlayer film for EUV lithography, irradiating, with EUV through a mask, the resist underlayer film for EUV lithography and a film of the resist for EUV lithography on the resist underlayer film, developing the film of the resist for EUV lithography, and transferring an image formed in the mask onto the substrate by dry etching so as to foam an integrated circuit device.

Effects of the Invention

A resist underlayer film that is obtained from the composition for forming a resist underlayer film for EUV lithography of the present invention reduces adverse effects caused by an underlying substrate or EUV to foam a favorable straight resist pattern and can improve the resist sensitivity. The resist underlayer film has a dry etching rate larger than that of a resist film formed as the upper layer and can readily transfer a resist pattern to an underlying film to be fabricated by a dry etching process.

Furthermore, the underlayer film formed using the composition for forming a resist underlayer film for EUV lithography of the present invention has excellent adhesion to a resist film or an underlying film.

The resist underlayer film for EUV lithography of the present invention is formed beneath a resist film for EUV lithography to improve the resist sensitivity during EUV irradiation and can form a clear resist pattern without requiring the effect of preventing reflected light, in contrast to the resist underlayer film (bottom anti-reflective coating) that is used in a photolithography process in order to prevent the reflected light generated from a substrate.

BEST MODES FOR CARRYING OUT THE INVENTION

The present invention is a composition for forming a resist underlayer film for EUV lithography that is used in the production of semiconductor devices using EUV lithography technique and that includes a novolac resin having a repeating unit structure containing a halogen atom and a solvent. The composition for forming a resist underlayer film for EUV lithography of the present invention is used in order to form a resist underlayer film between an underlying film, to which a resist pattern is transferred, on a substrate and the resist film.

The present invention is the composition for forming a resist underlayer film for an EUV lithography process that is used in the production of semiconductor devices and that includes a novolac resin containing a halogen atom. The novolac resin includes a cross-linkable group composed of an epoxy group, a hydroxy group, or a combination thereof. There are cases in which the novolac resin includes a repeating unit structure containing a halogen atom in which a cross-linkable group is present, or the novolac resin includes a repeating unit structure containing a halogen atom and a repeating unit structure containing a cross-linkable group. The cross-linkable group may be introduced to a main chain and/or a side chain of the novolac resin.

The introduced cross-linkable group may cause cross-linking reaction with a cross-linking agent component introduced in the composition for forming a resist underlayer film of the present invention during heat baking. The resist underlayer film foamed by such a cross-linkage forming reaction can prevent the intermixing with a resist film applied as the upper layer.

The composition for forming a resist underlayer film includes the novolac resin and a solvent and may further include a cross-linking agent, a cross-linking catalyst, and a surfactant.

The composition for forming a resist underlayer film for EUV lithography of the present invention has a solid content of 0.1 to 50% by mass and preferably 0.5 to 30% by mass. The solid content is a residue that is obtained by removing a solvent component from the composition for forming a resist underlayer film for EUV lithography.

The composition for forming a resist underlayer film for EUV lithography includes the novolac resin in an amount of 20% by mass or more, for example, 20 to 100% by mass, 30 to 100% by mass, 50 to 90% by mass, or 60 to 80% by mass, in the solid content.

The novolac resin contains a halogen atom in an amount of at least 10% by mass, preferably 10 to 80% by mass, and more preferably 20 to 70% by mass.

The halogen atom is a fluorine atom, a chlorine atom, a bromine atom, or an iodine atom, and in particular, the halogen atom is preferably a bromine atom, an iodine atom, or a combination thereof.

The novolac resin can be obtained by a reaction of a hydroxy group of a novolac resin or a functional group derived from the hydroxy group and a compound containing a halogen atom. Examples of the functional group derived from the hydroxy group include an oxyglycidyl group that is obtained by a reaction of a hydroxy group and epichlorohydrin. The compound containing a halogen atom preferably includes a functional group that reacts with a hydroxy group or an epoxy group of the novolac resin, such as a hydroxy group and a carboxy group. Examples of the compound containing a halogen atom include bromophenol, bromocatechol, bromoresorcinol, bromohydroquinone, dibromophenol, dibromocatechol, dibromoresorcinol, dibromohydroquinone, iodophenol, iodocatechol, iodoresorcinol, iodohydroquinone, diiodophenol, diiodocatechol, diiodoresorcinol, diiodohydroquinone, bromobenzoic acid, dibromobenzoic acid, tribromobenzoic acid, iodobenzoic acid, diiodobenzoic acid, tribromobenzoic acid, bromosalicylic acid, dibromosalicylic acid, tribromosalicylic acid, iodosalicylic acid, diiodosalicylic acid, and triiodosalicylic acid.

A reaction product of a novolac resin and a halogenated benzoic acid is exemplified, and a reaction product of an epoxidized novolac resin and a halogenated benzoic acid is exemplified. Examples of the epoxidized novolac resin include a glycidyloxy novolac resin, and examples of the halogenated benzoic acid include dibromobenzoic acid, diiodobenzoic acid, dibromosalicylic acid, and diiodosalicylic acid.

The novolac resin has a weight average molecular weight of 500 to 1,000,000, preferably 700 to 500,000, even more preferably 1,000 to 300,000, and further more preferably 1,000 to 100,000.

Specific examples of the novolac resin include the following compounds.

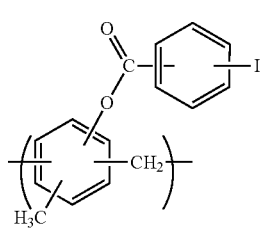

(1-1)

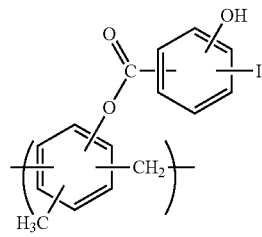

(1-2)

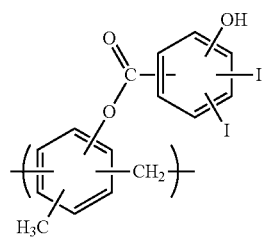

(1-3)

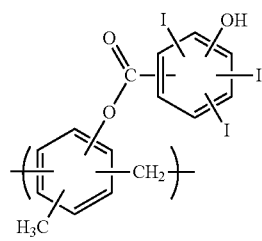

(1-4)

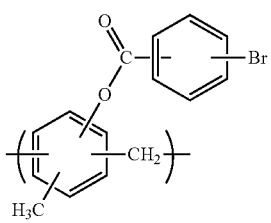

(1-5)

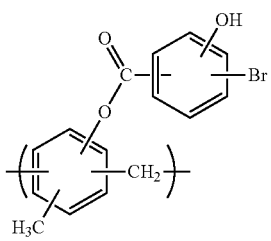

(1-6)

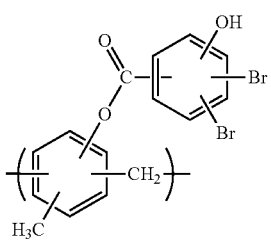

(1-7)

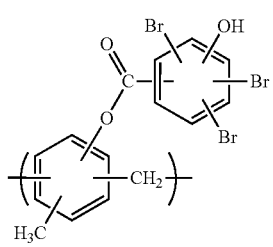
(1-7-2)
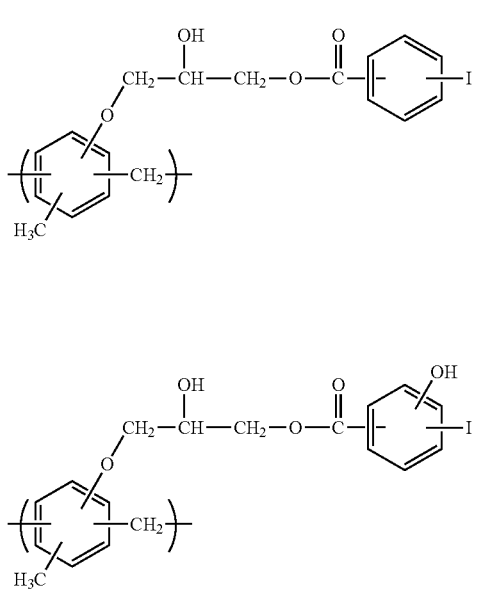
(1-8)
(1-9)
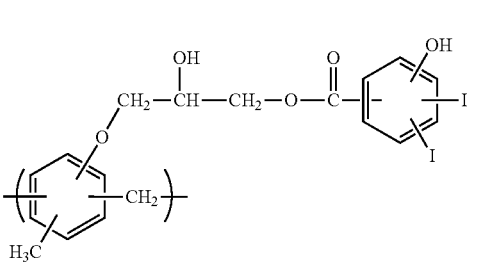
(1-10)
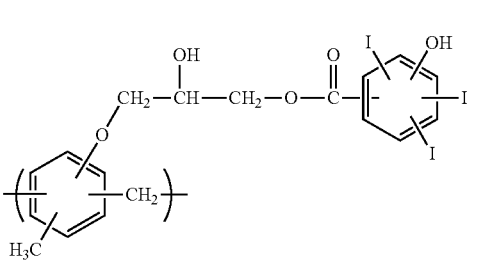
(1-11)
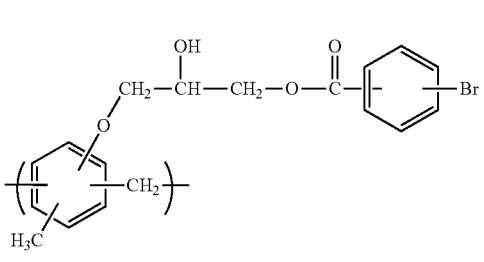
(1-12)
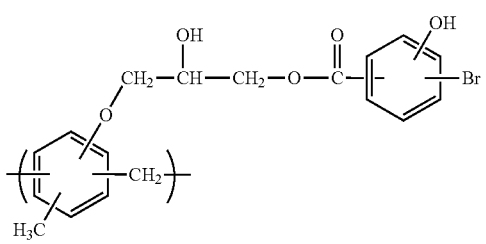
(1-13)
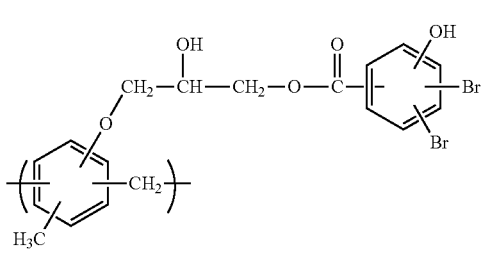
(1-14)
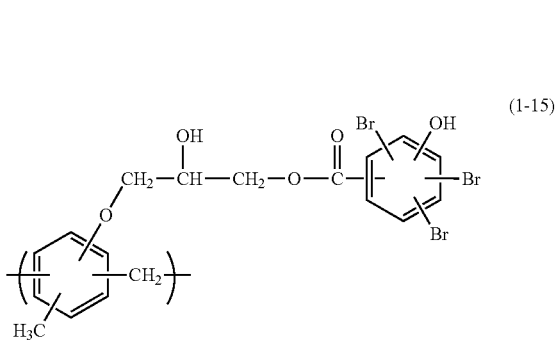
(1-15)
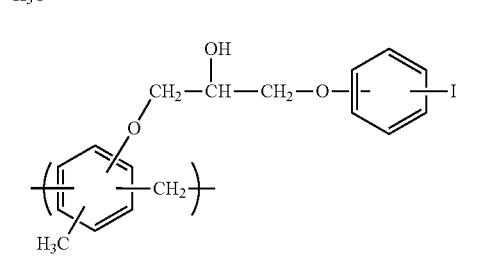
(1-16)
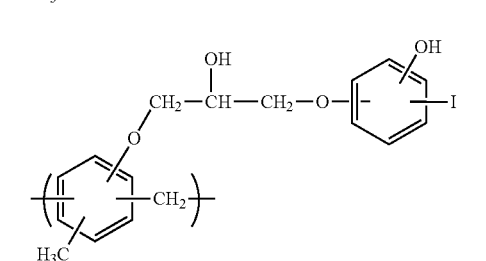
(1-17)
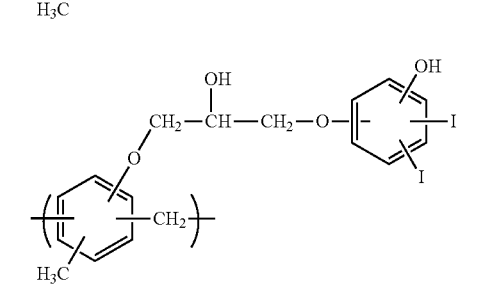
(1-18)

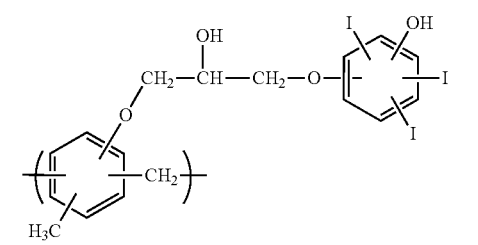
(1-19)

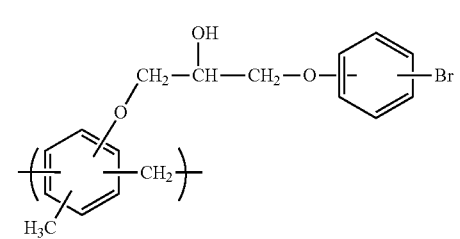
(1-20)

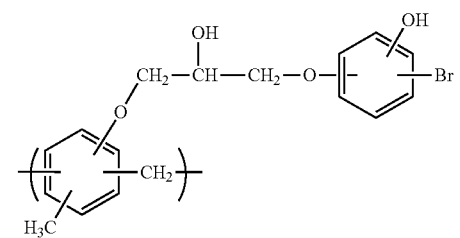
(1-21)

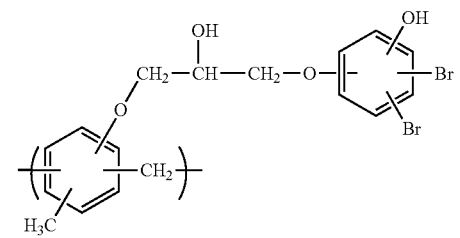
(1-22)

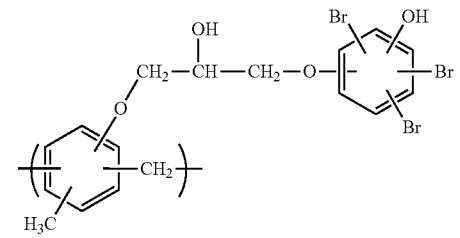
(1-23)

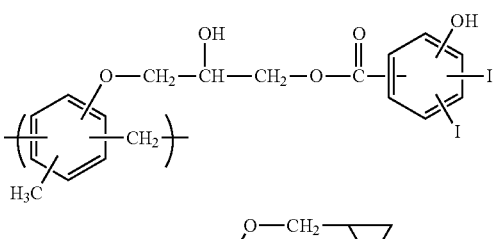
(1-24)

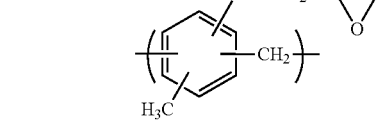

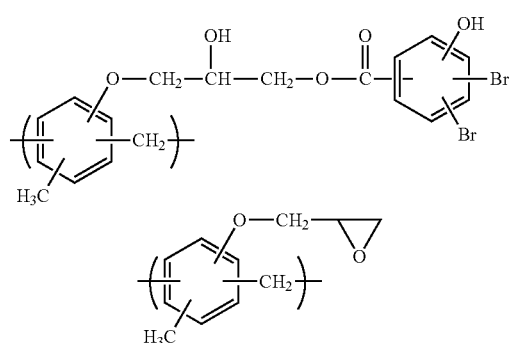
(1-25)

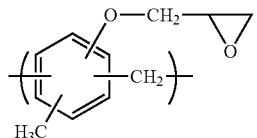

In the composition for forming a resist underlayer film for EUV lithography of the present invention, the content (% by mass) of a halogen atom contained in the polymer compound in the composition may be varied. That is, the content (% by mass) of a halogen atom contained in the polymer compound can be changed, for example, by the selection of a compound to be reacted with the polymer obtained by polymerization reaction of the polymer compound, and the selection of the number and the type of a halogen atom contained. Then, the use of polymer compounds having different halogen atom contents (% by mass) can change the halogen atom content (% by mass) in the solid content of the composition for forming a resist underlayer film, namely, can change the halogen atom content (% by mass) in the resist underlayer film after film formation. The change of the halogen atom content (% by mass) in the resist underlayer film after film formation can change resist sensitivity and a resist profile. Here, the solid content of the composition for forming a resist underlayer film is a component that is obtained by removing a solvent component from the composition for forming a resist underlayer film, and the halogen atom content (% by mass) in the resist underlayer film after film formation is a halogen atom content (% by mass) in the solid content of the composition for forming a resist underlayer film.

The composition for forming a resist underlayer film of the present invention is preferably cross-linked by heating after application in order to prevent the intermixing with a photoresist as an overcoat, and the composition for forming a resist underlayer film of the present invention may further include a cross-linking agent component. Examples of the cross-linking agent include a melamine compound and a substituted urea compound having a cross-linkable substituent such as a methylol group and a methoxymethyl group and a polymer compound having an epoxy group. A cross-linking agent having at least two cross-linkable substituents is preferred, and examples thereof include compounds such as a methoxymethylated glycoluril and a methoxymethylated melamine. Tetramethoxymethylglycoluril and hexamethoxymethylolmelamine are particularly preferred. The additive amount of the cross-linking agent varies depending on a coating solvent to be used, an underlying substrate to be used, a solution viscosity to be required, a film shape to be required, or the like, but is 0.001 to 20% by mass, preferably 0.01 to 15% by mass, and more preferably 0.05 to 10% by mass, based on 100% by mass of the total composition. The cross-linking agent may cause cross-linking reaction by self-condensation, but, when a cross-linkable substituent is present in the novolac resin that is used in the composition for forming a resist underlayer film of the present invention, the cross-linking agent can cause the cross-linking reaction with the cross-linkable substituent.

As a catalyst for accelerating the cross-linking reaction, the composition may include an acidic compound such as p-toluenesulfonic acid, trifluoromethanesulfonic acid, pyridinium p-toluenesulfonate, salicylic acid, sulfosalicylic acid, citric acid, benzoic acid, and hydroxybenzoic acid and/or a thermal acid generator such as 2,4,4,6-tetrabromocyclohexadienone, benzoin tosylate, and 2-nitrobenzyl tosylate. The combination amount is 0.02 to 10% by mass and preferably 0.04 to 5% by mass based on 100% by mass of the total solid content.

The composition for forming a resist underlayer film for EUV lithography of the present invention may include an acid generator that generates an acid by EUV irradiation, in order to match the acidity to that of a resist applied as the upper layer in a lithography process. Preferred examples of the acid generator include onium salt compound acid generators such as bis(4-tert-butylphenyl)iodonium trifluoromethanesulfonate and triphenylsulfonium trifluoromethanesulfonate; halogen-containing compound acid generators such as phenyl-bis(trichloromethyl)-s-triazine; and sulfonic acid compound acid generators such as benzoin tosylate and N-hydroxysuccinimide trifluoromethanesulfonate. The additive amount of the acid generator is 0.02 to 3% by mass and preferably 0.04 to 2% by mass based on 100% by mass of the total solid content.

A rheology control agent, an adhesion assistant, a surfactant, and the like may further be added to the composition for forming a resist underlayer film for EUV lithography of the present invention as necessary in addition to the above components.

The rheology control agent is added mainly in order to improve flowability of the composition for forming a resist underlayer film. Specific examples include phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. The rheology control agent is commonly included in a ratio of less than 30% by mass based on 100% by mass of the total composition of the composition for forming a resist underlayer film.

The adhesion assistant is added mainly in order to improve adhesion between a substrate or a photoresist and the composition for forming a resist underlayer film, in particular, in order not to remove the photoresist during development. Specific examples include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; ureas such as 1,1-dimethylurea and 1,3-dimethylurea; and thiourea compounds. The adhesion assistant is commonly included in a ratio of less than 5% by mass and preferably less than 2% by mass based on 100% by mass of the total composition of the composition for forming a resist underlayer film.

The composition for forming a resist underlayer film for EUV lithography of the present invention may include a surfactant in order not to generate pinholes or striation and in order to further improve coating properties to surface irregularity. Examples of the surfactant include: nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene oetylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants including EFTOP EF301, EF303, EF352 (manufactured by Tohkem Products Corp.), MEGAFAC F171, F173 (manufactured by Dainippon Ink and Chemicals, Inc.), Fluorad FC430, FC431 (manufactured by Sumitomo 3M Ltd.), and Asahiguard AG710, Surflon S-382, SC101, SC102, SC103, SC104, SC105, SC106 (manufactured by Asahi Glass Co., Ltd.); and organosiloxane polymer KP 341 (manufactured by Shin-Etsu Chemical Co., Ltd.). The compounding amount of the surfactant is commonly 0.2% by mass or less and preferably 0.1% by mass or less based on 100% by mass of the total composition of the composition for forming a resist underlayer film of the present invention. These surfactants may be added singly or in combination of two or more of them.

Examples of the solvent dissolving the polymer include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents are used singly or in combination of two or more of them.

High-boiling solvents such as propylene glycol monobutyl ether and propylene glycol monobutyl ether acetate may be mixed to be used. Among these solvents, propylene glycol monomethyl ether, propylene glycol monomethyl ether acetate, ethyl lactate, butyl lactate, and cyclohexanone are preferred in order to improve leveling properties.

An EUV resist that is applied as the upper layer of the resist underlayer film for EUV lithography of the present invention may be positive or negative. Examples of the resist include a chemically amplified resist composed of an acid generator and a binder having a group that is degraded by an acid to change an alkali dissolution rate, a chemically amplified resist composed of an alkali soluble binder, an acid generator, and a low molecular weight compound that is degraded by an acid to change the alkali dissolution rate of a resist, a chemically amplified resist composed of an acid generator, a binder having a group that is degraded by an acid to change an alkali dissolution rate, and a low molecular weight compound that is degraded by an acid to change the alkali dissolution rate of a resist, a non-chemically amplified resist composed of a binder having a group that is degraded by EUV to change an alkali dissolution rate, and a non-chemically amplified resist composed of a binder having a moiety that is cleaved by EUV to change an alkali dissolution rate.

Examples of usable developer for a positive resist having a resist underlayer film that is formed by using the composition for forming a resist underlayer film for EUV lithography of the present invention include aqueous solutions of alkalis including: inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amities such as pyrrole and piperidine. To the above aqueous alkali solutions, an alcohol such as isopropyl alcohol or a surfactant such as a nonionic surfactant in a suitable amount may be added for use. Among those developers, the quaternary ammonium salts are preferred, and tetramethylammonium hydroxide and choline are more preferred.

The resist underlayer film formed from the composition for forming a resist underlayer film for EUV lithography containing the novolac resin having a repeating unit structure containing a halogen atom of the present invention includes a halogen atom and therefore has a comparatively large dry etching rate. The dry etching rate can be controlled by varying the halogen atom content.

In the present invention, the composition for forming a resist underlayer film for EUV lithography is applied onto a substrate and baked to form a resist underlayer film for EUV lithography.

In the present invention, a semiconductor device is produced by a step of applying the composition for forming a resist underlayer film for EUV lithography onto a substrate having a film to be fabricated for forming a transferring pattern and baking the composition so as to form a resist underlayer film for EUV lithography, and a step of applying a resist for EUV lithography onto the resist underlayer film for EUV lithography, irradiating, with EUV through a mask, the resist underlayer film for EUV lithography and a film of the resist for EUV lithography on the resist underlayer film, developing the resist film for EUV lithography, and transferring an image formed in the mask onto the substrate by dry etching so as to form an integrated circuit device.

A semiconductor device to which the composition for forming a resist underlayer film for EUV lithography of the present invention is applied has a structure composed of, on a substrate, a film to be fabricated to which a pattern is transferred, a resist underlayer film, and a resist in this order. The resist underlayer film is formed by applying the composition for forming a resist underlayer film for EUV lithography that includes a polymer compound having a repeating unit structure containing a halogen atom and a solvent to the film to be fabricated to which a pattern is transferred and heat treating the composition. The resist underlayer film reduces adverse effects caused by an underlying substrate or EUV to form a favorable straight resist pattern, and can give a margin sufficient to the amount of EUV irradiation. The resist underlayer film has a dry etching rate larger than that of a resist film formed as the upper layer and can readily transfer a resist pattern to an underlying film to be fabricated by a dry etching process.

EXAMPLES

Synthetic Example 1

In 183.8 g of propylene glycol monomethyl ether, 6.0 g of an epoxidized cresol novolac resin and 9.7 g of 3,5-diiodosalicylic acid were dissolved, and then 0.23 g of benzyltriethylammonium was added. The whole was reacted at the reflux temperature for 24 hours to give a solution of a polymer compound having a repeating unit structure of Formula (2-1). The obtained polymer compound was subjected to GPC analysis. The weight average molecular weight of the obtained polymer compound was 3,700 in terms of standard polystyrene.

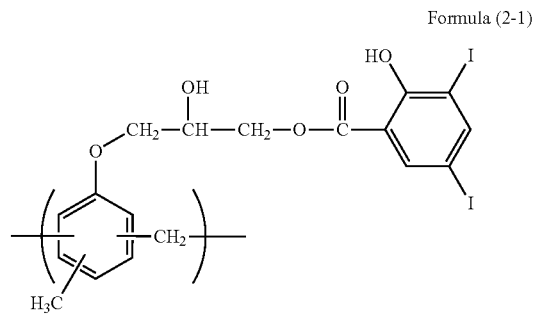

Formula (2-1)

Synthetic Example 2

In 285.3 g of propylene glycol monomethyl ether, 30.0 g of an epoxidized phenol novolac resin and 40.4 g of 3,5-dibromobenzoic acid were dissolved, and then 0.91 g of benzyltriethylammonium was added. The whole was reacted at the reflux temperature for 24 hours to give a solution of a polymer compound having a repeating unit structure of Formula (2-2). The obtained polymer compound was subjected to GPC analysis. The weight average molecular weight of the obtained polymer compound was 1,800 in terms of standard polystyrene.

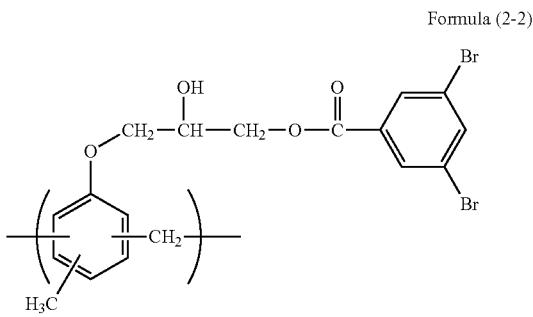

Formula (2-2)

Synthetic Example 3

In 177.7 g of propylene glycol monomethyl ether, 6.0 g of an epoxidized cresol novolac resin, 7.3 g of 3,5-diiodosalicylic acid, and 0.8 g of salicylic acid were dissolved, and then 0.23 g of benzyltriethylammonium was added. The whole was reacted at the reflux temperature for 24 hours to give a solution of a polymer compound having a repeating unit structure of Formula (2-3-1) and a repeating unit structure of Formula (2-3-2). The obtained polymer compound was subjected to GPC analysis. The weight average molecular weight of the obtained polymer compound was 3,500 in terms of standard polystyrene.

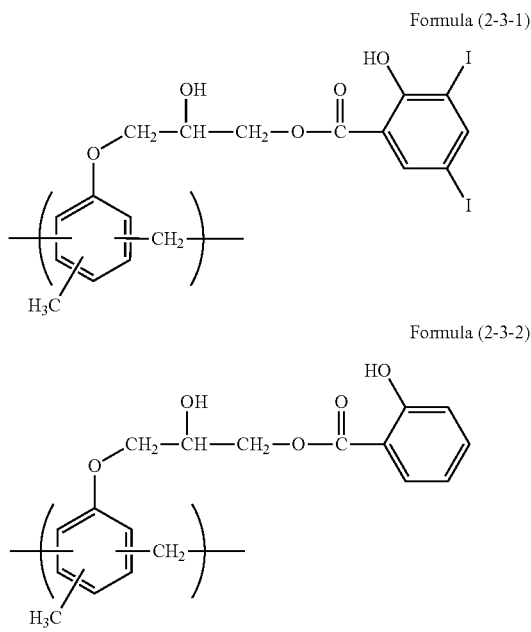

Formula (2-3-1)

Formula (2-3-2)

Example 1

Into 10 g of a propylene glycol monomethyl ether solution containing 2 g of the polymer compound obtained in Synthetic Example 1, 0.5 g of tetrabutoxymethylglycoluril, 0.01 g of p-toluenesulfonic acid, 0.04 g of pyridinium p-toluenesulfonate, and 0.004 g of MEGAFAC R-30 (surfactant, manufactured by Dainippon Ink and Chemicals, Inc.) were mixed. The mixture was dissolved in 49.8 g of propylene glycol monomethyl ether, 16.5 g of propylene glycol monomethyl ether acetate, and 8.3 g of cyclohexanone to make a solution. Then, the solution was filtered using a polyethylene microfilter having a pore diameter of 0.10 μm and further filtered using a polyethylene microfilter having a pore diameter of 0.05 μm to prepare a composition for forming a resist underlayer film.

Example 2

Into 10 g of a propylene glycol monomethyl ether solution containing 2 g of the polymer compound obtained in Synthetic Example 2, 0.5 g of tetrabutoxymethylglycoluril, 0.01 g of p-toluenesulfonic acid, 0.04 g of pyridinium p-toluenesulfonate, and 0.004 g of MEGAFAC R-30 (surfactant, manufactured by Dainippon Ink and Chemicals, Inc.) were mixed. The mixture was dissolved in 49.8 g of propylene glycol monomethyl ether, 16.5 g of propylene glycol monomethyl ether acetate, and 8.3 g of cyclohexanone to make a solution. Then, the solution was filtered using a polyethylene microfilter having a pore diameter of 0.10 μm and further filtered using a polyethylene microfilter having a pore diameter of 0.05 μm to prepare a composition for forming a resist underlayer film.

Example 3

Into 10 g of a propylene glycol monomethyl ether solution containing 2 g of the polymer compound obtained in Synthetic Example 3, 0.5 g of tetrabutoxymethylglycoluril, 0.01 g of p-toluenesulfonic acid, 0.04 g of pyridinium p-toluenesulfonate, and 0.004 g of MEGAFAC R-30 (surfactant, manufactured by Dainippon Ink and Chemicals, Inc.) were mixed. The mixture was dissolved in 49.8 g of propylene glycol monomethyl ether, 16.5 g of propylene glycol monomethyl ether acetate, and 8.3 g of cyclohexanone to make a solution. Then, the solution was filtered using a polyethylene microfilter having a pore diameter of 0.10 μm and further filtered using a polyethylene microfilter having a pore diameter of 0.05 μm to prepare a composition for forming a resist underlayer film.

In Table 1, for the measurement of the ratio of dry etching rate of the applied underlayer film of the present invention to a resist (resist underlayer film/resist), $CF_4$ gas was used as the etching gas.

TABLE 1

| Ratio of dry etching rate (resist underlayer film/resist film) | |
|---|---|
| Example 1 | 1.3 |
| Example 2 | 1.3 |
| Example 3 | 1.3 |

(Resist Pattern Formation Test)

The solution obtained in Example 1 was applied onto a bare silicon wafer with a spinner. The coated silicon wafer was heated on a hot plate at 205° C. for 1 minute to form a resist underlayer film for EUV lithography (a film thickness of 0.03 μm). Onto the resist underlayer film for EUV lithography, a resist solution for EUV lithography (polyhydroxystyrene type) was applied with a spinner and heated on a hot plate to form a resist film (a film thickness of 0.08 μm). To the film, EUV exposure was carried out using an EUV exposure apparatus manufactured by CANON through a mask having a light passing pattern so that the line width of the resist would have a dense line of 0.045 μm or 0.032 μm after development. Next, the wafer was heated on a hot plate again, then cooled, and subsequently developed using an alkali developer for 60 seconds. The obtained resist pattern was observed under a scanning electron microscope. The optimum exposure amount was 11.68 mJ/cm$^2$ or 12.25 mJ/cm$^2$ for the formation of a dense pattern of 0.045 μm or 0.032 μm, respectively.

In contrast, when onto a bare silicon wafer, a resist for EUV lithography was applied and then a resist pattern was formed, the amount of EUV irradiation energy was 12.53 mJ/cm$^2$ for 0.045 μm and was 13.21 mJ/cm$^2$ for 0.032 μm. The results show that the resist underlayer film for EUV lithography formed from the composition for forming a resist underlayer film for EUV lithography of the present invention reduces adverse effects caused by an underlying substrate or EUV so that the resist sensitivity can be improved, and also has a dry etching rate larger than that of a resist.

The embodiments of the composition for forming a resist underlayer film for EUV lithography of the present invention have been described above, but the technical scope of the present invention is not limited to the scope described in the embodiments. Various modifications or improvements may be made to the embodiments.

INDUSTRIAL APPLICABILITY

The present invention can provide: the composition of a resist underlayer film for EUV lithography that is used in a production process of devices employing EUV lithography, that reduces adverse effects caused by an underlying substrate or EUV, and that has a beneficial effect on the formation of a favorable resist pattern; and the method for forming a resist pattern that uses the composition of a resist underlayer film for EUV lithography.

The invention claimed is:

1. A method for producing a semiconductor device comprising the steps of:
    applying a composition for forming a resist underlayer film for EUV lithography comprising a novolac resin containing a halogen atom onto a substrate having a film to be fabricated for forming a transferring pattern and baking the composition so as to form a resist underlayer film for EUV lithography; and
    applying a resist for EUV lithography onto the resist underlayer film for EUV lithography, irradiating, with EUV through a mask, the resist underlayer film for EUV lithography and a film of the resist for EUV lithography on the resist underlayer film, developing the film of the resist for EUV lithography, and transferring an image formed in the mask onto the substrate by dry etching so as to form an integrated circuit device.

2. The method for producing a semiconductor device according to claim 1, wherein the novolac resin containing a halogen atom includes a cross-linkable group composed of an epoxy group, a hydroxy group, or a combination of an epoxy group and a hydroxy group.

3. The method for producing a semiconductor device according to claim 1, wherein the halogen atom is a bromine atom or an iodine atom.

4. The method for producing a semiconductor device according to claim 1, wherein the novolac resin containing a halogen atom is a reaction product of a novolac resin or an epoxidized novolac resin and a halogenated benzoic acid.

5. The method for producing a semiconductor device according to claim 1, wherein the novolac resin containing a halogen atom is a reaction product of a glycidyloxy novolac resin and diiodosalicylic acid.

6. The method for producing a semiconductor device according to claim 1, wherein the composition includes the novolac resin containing a halogen atom, a cross-linking agent, a cross-linking catalyst, and a solvent.

7. The method for producing a semiconductor device according to claim 1, wherein the composition further comprises an acid generator.

8. The method for producing a semiconductor device according to claim 1, wherein the novolac resin containing a halogen atom is a novolac resin having a weight average molecular weight of 1,000 to 100,000.

* * * * *